United States Patent
Kraft et al.

(10) Patent No.: US 6,261,934 B1
(45) Date of Patent: Jul. 17, 2001

(54) DRY ETCH PROCESS FOR SMALL-GEOMETRY METAL GATES OVER THIN GATE DIELECTRIC

(75) Inventors: Robert Kraft; Antonio L. P. Rotondaro, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/206,074

(22) Filed: Dec. 4, 1998

Related U.S. Application Data
(60) Provisional application No. 60/080,040, filed on Mar. 31, 1998.

(51) Int. Cl.$^7$ ................................................. H01L 21/306

(52) U.S. Cl. .......................... 438/592; 438/669; 438/720; 438/742

(58) Field of Search ..................... 438/197, 592, 438/669, 742, 720, FOR 126, FOR 193

(56) References Cited

U.S. PATENT DOCUMENTS

| | | |
|---|---|---|
| 5,244,836 * | 9/1993 | Lim . |
| 5,374,832 * | 12/1994 | Tung et al. . |
| 5,401,356 | 3/1995 | Enami et al. .................. 156/643 |
| 5,429,987 * | 7/1995 | Allen . |
| 5,529,197 | 6/1996 | Grewal .................... 216/68 |
| 5,529,945 | 6/1996 | Rao ....................... 437/52 |
| 5,543,362 | 8/1996 | Wu ....................... 437/200 |
| 5,946,600 * | 8/1999 | Hurwitz et al. . |

FOREIGN PATENT DOCUMENTS

| | | | |
|---|---|---|---|
| 0 284 794 A1 | 3/1988 | (EP) | ............. H01L/21/285 |
| 0 388 749 A1 | 3/1990 | (EP) | ............. C23G/5/00 |
| 0 574 075 A1 | 6/1993 | (EP) | ............. C23C/16/54 |
| 0 661 736 A1 | 12/1994 | (EP) | ............. H01L/21/768 |
| 6-53494 | 2/1994 | (JP) | ............. H01L/29/784 |
| 7-202189 | 8/1994 | (JP) | ............. H01L/29/78 |
| 7-66176 | 3/1995 | (JP) | ............. H01L/21/3065 |
| WO 96/27899 | 9/1996 | (WO) | ............. H01L/21/321 |

OTHER PUBLICATIONS

Hu et al., "Feasibility of W/TiN Metal–gate for Conventional 0.12$\mu$m CMOS Technology and Beyond", 1997 IEDM.

Rotondaro et al., "Dry Process for the Definition of Sub–0.1$\mu$m W/TiN Gates", ECS Fall, Paris 1997.

Lee et al., "Characteristics of CMOSFETs with Sputter–Deposited W/TiN Stack Gate", 1995 Symposium on VLSI Technology Digest of Technical Papers, p. 119.

Lee et al., "Gate Oxide Integrity (GOI) of MOS Transistors with W/TiN Stacked Gate", 1996 Symposium on VLSI Technology Digest of Technical Papers, p. 208.

Coffman et al., "A 1Mb CMOS EPROM with a 13.5$\mu$m$^2$ cell", 1987 IEEE International Solid–State Circuits Conference Digest of Technical Papers, pp. 72–73 & 343.

(List continued on next page.)

*Primary Examiner*—George Fourson
*Assistant Examiner*—Joannie Adelle Garcia
(74) *Attorney, Agent, or Firm*—Alan K. Stewart; Wade James Brady, III; Frederick J. Telecky, Jr.

(57) ABSTRACT

Fabrication of metal-on-conductive-diffusion-barrier-on-gate-dielectric structures is done by: etching the metal, by plasma-assisted anisotropic etching, down to and into the barrier metal; and then etching the remainder of the barrier layer by a dry chemical-downstream-etching process, during which the barrier layer is not exposed to ion bombardment. In the case of tungsten over titanium nitride, high selectivity and good profiles are preferably obtained, by: during the tungsten etch, using a combination of low temperature, relatively low bias, and the addition of nitrogen; and during the titanium nitride etch, using a chemical downstream etch instead of the conventional wet etch (in boiling H2SO4). (This allows better control of undercutting, and eliminates wet strip process.)

12 Claims, 12 Drawing Sheets

OTHER PUBLICATIONS

Bader et al., "Integrated Processing Equipment", May 1990 Solid State Technology, pp. 149–154.

Cotler et al., "Plasma–Etch Technology", IEEE Circuits and Devices Magazine, Jul. 1990, pp. 38–43.

Pearton et al., "Letter to the Editor—Hybrid electron cyclotron resonance–RF plasma etching of $TiN_x$ thin films grownby low pressure rapid thermal metalorganic chemical vapour deposition", Semicond. Sci. Technol., Aug. 1991, pp. 830–832.

* cited by examiner

DRY ETCH PROCESS FOR SMALL-GEOMETRY METAL GATES OVER THIN GATE DIELECTRIC

This application claims priority under 35 USC §119(e)(1) of provisional application No. 60/080,040 filed Mar. 31, 1998.

BACKGROUND AND SUMMARY OF THE INVENTION

The present invention relates to integrated circuit structures and fabrication methods, and specifically to methods for etching semiconductor-free transistor gate stacks.

BACKGROUND: THE NEED FOR LOW-RESISTIVITY GATE MATERIALS

One of the major problems in shrinking integrated circuit geometries is the distributed resistance and parasitic capacitance of the signal lines, which reduce the propagation speed of signals. The additional delays thus introduced reduce the potential speed of the chip.

This is a particular problem for DRAMs, since the word-lines are densely packed together, and the capacitive coupling between adjacent lines becomes very significant. Moreover, the sheet resistance of the lines cannot usefully be improved by increasing the height of the lines, since this also increases the capacitive coupling between adjacent lines. There has therefore been great pressure to find materials with a lower resistivity to replace the traditional polysilicon/silicide lines. This has impelled efforts to design metal into the gate line structure. One example of this is a gate stack structure which includes a metal over a conductive nitride over the gate dielectric, without any semiconductor material in the stack.

BACKGROUND: THE PROBLEM OF BURIED CHANNELS

It has long been recognized that the use of an N-type polysilicon gate for P-channel transistors will tend to produce a buried channel for submicron transistor geometries. This is due to the difference in work-function between the channel and the gate. The "work-function" of a material is the energy difference between that material and vacuum, for a single carrier (e.g. a single electron).

As geometries shrink into the deep submicron regime (below 0.5 or 0.35 micron), such buried channels become very undesirable (due e.g. to reduced drive capability). Thus one of the constraints on new gate materials is a good work-function match to the semiconductor used.

BACKGROUND: METAL GATE STRUCTURES

The fabrication of advanced sub-tenth-micron devices will require replacement of the highly doped polysilicon gate electrode by new gate materials. The gate electrode stack for advanced devices should provide low sheet resistance to minimize interconnect delays, have a work function near to the silicon mid-gap to enable both n and p-type transistors to operate in surface channel mode, and prevent gate electrode depletion effects (to assure that the effective oxide thickness is equal to the physical oxide thickness).

Titanium nitride is a very promising candidate for gate electrode material. It has a work function near the mid-gap point of silicon (4.65 eV) and eliminates gate depletion effects. However, titanium nitride has a quite high resistivity (120 mΩ-cm), and therefore needs to be used in conjunction with a material with higher conductivity for low interconnect delays to be achieved. For that purpose, tungsten (resistivity of 8 mΩ-cm) has been used.

The definition of the gate electrode stack on ultra-thin (<3 nm) gate oxides for sub-tenth-micron transistors imposes a severe challenge to the etch process. Very high selectivity to SiO2 has to be achieved to avoid oxide punchthrough and subsequent damage to the silicon in the source and drain regions. Even when successfully stopped in the gate oxide, the conventional gate etch process introduces corner damage to the gate structure that needs to be annealed to guarantee good gate oxide integrity (GOI) properties of the transistor. However, it is difficult to anneal the corner damage on metal gate structures, since tungsten and titanium nitride readily oxidize in conventional oxidation processes. One solution to this problem might be to use a wet etch to slightly undercut the titanium nitride layer, moving the active gate region away from the damaged corners. However, since the selectivity of the wet etch towards tungsten is very low, the tungsten sidewall needs to be protected with a spacer prior to the titanium nitride undercut etch. This adds significant complexity to the device fabrication flow and severely reduces the process window, since the amount of undercut, and consequently the effective gate length, depends on the spacer thickness. Another approach might be to etch the titanium nitride with a process that does not cause corner damage.

Chlorine-based plasma etching chemistries are commonly used for etching titanium nitride. However, in a W/TiN/SiO2 structure, chlorine-based titanium nitride etch chemistries can cause corrosion of the tungsten layer.

Metal+Barrier+Dielectric Gate Stack Process and Structure

The present application discloses new processes for fabricating metal-on-conductive-diffusion-barrier-on-gate-dielectricstructures. This is done by: etching the metal, by plasma-assisted anisotropic etching, down to and into the barrier layer; and then etching the remainder of the barrier layer by a dry chemical-downstream-etching process, during which the barrier layer is not exposed to ion bombardment. In one specific example, a chemical downflow etch based on a chemistry consisting of oxygen (O2) and hexafluoroethane (C2F6) was used to successfully fabricate sub-tenth-micron W/TiN gate structures on ultra-thin (<3 nm) silicon dioxide. The electrical characteristics of the devices indicated excellent process uniformity and no charge or corner damage effects. In some but not all embodiments, a photoresist ashing step was performed after the plasma-assisted metal etch, but before the final barrier layer etch.

Advantages of the disclosed methods and structures include:

Controllable titanium nitride etch rate and undercut;
All dry etch and clean process;
Sub-tenth-micron gate lengths attainable;
Damage free gate oxides at and below 3 nm thickness are attainable;
Better control of titanium nitride undercut with dry process;
Ability to etch metal gate without damaging underlying gate oxide;
Ability to etch sub-tenth-micron metal gates;
Resist and titanium nitride removed in a single step;
No smile oxidation is required since the gate oxide is undamaged;
An aggressive tungsten etch, with heavy bombardment, can be used;
Plasma damage to the gate oxide is avoided; and
The problem of wet chemical disposal is eliminated.
Moreover, no tungsten corrosion occurs as a result of the brief TiN fluoro-etch times used in the presently preferred embodiment.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

General Overview

Figure 1:
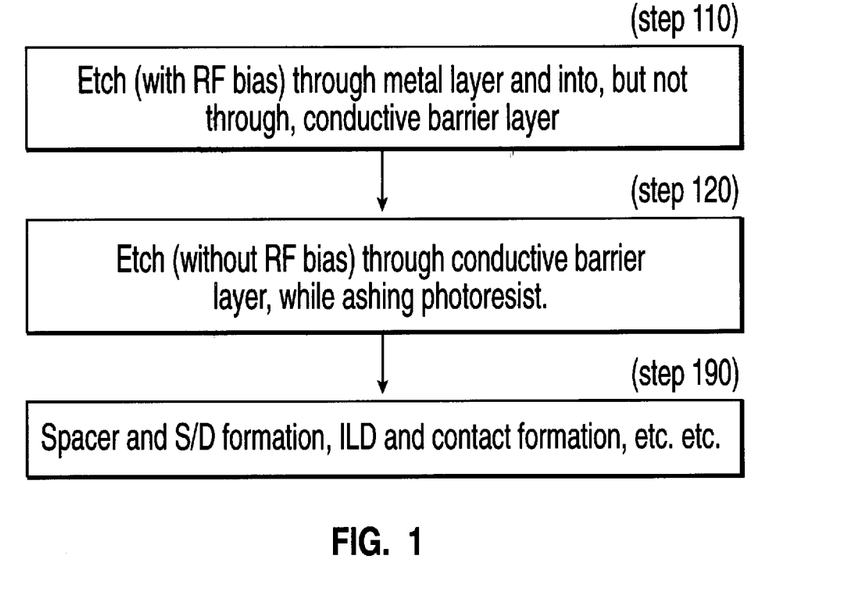
FIG. 1 is a flow chart which schematically gives an overview of the disclosed process innovations.

FIG. 1 is a flow chart which schematically gives an overview of the disclosed process innovations. The layers of the gate stack include metal (preferably covered by a dielectric capping layer) overlying a conductive barrier material, which itself overlies the gate dielectric. (Note that this stack preferably does not include any semiconductor material, and specifically not polysilicon.) After the stack is in place, a patterned photoresist layer is formed over it, the steps shown begin.

In step 110, a plasma etching step is performed (with RF bias) to etch through metal layer and into, but not through, the conductive barrier layer.

In step 120, another etching step, without RF bias, etches through the conductive barrier layer, while also ashing (i.e. removing) the remaining photoresist. This can be a multi-part etching sequence, as described below.

This sequence of steps is followed by conventional steps 190 to complete transistor formation (spacer and source/drain formation, etc.) and to connect the transistors thus formed into functional electrical circuits (interlevel dielectric formation, contact formation, etc.).

Overview of W/TiN/SiO2 Embodiments

These concepts have been demonstrated in a W/TiN/SiO2 gate stack. Following is a digest of some of the details of successful implementations of this class of embodiments.

The tungsten etch step 110 preferably also etches a cap oxide or cap nitride layer over the tungsten. For example, this has been successfully done by using a low pressure, high density plasma (e.g. with SF6/N2 source gasses) to etch the capping layer and tungsten metal layer, and stop in the TiN layer. This has been demonstrated with a high selectivity of 7:1 (7:1 W:TiN etch rate). The photoresist and TiN are then removed with a C2F6/O2 chemical downstream etch. Typical material thicknesses and gate dimensions for which this process has been demonstrated are:

| | |
|---|---|
| Gate Length | <0.1 microns; |
| Si3N4 or SiO2 | 100 nm; |
| W | 80 nm; |
| TiN | 10–20 nm; and |
| Gate Oxide | 3 nm. |

Step 120 is performed by using a chemical downstream etch to remove the remaining TiN and photoresist, while stopping on the gate oxide. This has been shown to achieve 18:1 TiN:oxide selectivity.

One sample set of conditions for these etches is:
W etch conditions
    Feedgas: 93 sccm SF6 plus 14 sccm N2
    Pressure: 6 mT
    Plasma Source: Helicon
    Source Power: 1700 W
    Wafer Power: 23 W
    Wafer Temp: 5 C.
    W: 5.5 nm/s
    TiN: 1.1 nm/s.

TiN etch conditions
   Feedgas: 3000 sccm O2 plus 6 sccm C2F6
   Pressure: 1.3 T
   Plasma Source: ICP
   Source Power: 975 W
   Wafer Temp: 23 C.
   TiN: 0.56 nm/s
   Oxide: 0.03 nm/s.

However, of course those skilled in the art can vary these recipes.

Experimental Results

Following is a more extensive account of a first group of results. This group of results shows a novel all dry process for defining sub-tenth-micron W/TiN gates on ultra-thin (<3 nm) gate oxides. The process was optimized to have high selectivity to gate oxide and W eliminating the need of capping the W during TiN etch. Also, it does not introduce charge or corner damage to the gate oxide making unnecessary the gate annealing (or "smiling oxidation") after etch.

The thicknesses of the different materials used in the metal gate stack were respectively: 50–150 nm of W, 10–30 nm of TiN and 3–5 nm of gate oxide. The gate stack was anisotropically etched (as described below) to halfway into the TiN layer. This prevents damage to the gate oxide. Subsequently, isotropic chemical downflow etch (CDE) was used to remove the remaining TiN with high selectivity towards the gate oxide.

The CDE process was developed in a Mattson ASPEN II asher. The system has an inductively coupled plasma (ICP) source that generates the excited species remote from the wafer surface. Two grounded metal grids prevent charged species from reaching the wafers assuring an isotropic process without any. charge damage. Oxygen (O2) and hexafluoroethane (C2F6) were selected as process gases. A flow ratio of O2 to C2F6 higher than 100 to 1 was used. Two process temperatures were investigated, 250 C. with the wafers placed on a heated chuck or room temperature with the wafers raised on three pins.

The optimization of the gate profile was assessed with transmission electron microscopy (TEM) analysis. The TiN thickness for the etch rate studies was measured using a 4-point probe system. The photoresist and oxide thickness were measured with an Optiprobe Thermawave tool.

The ramp voltage breakdown characteristics of the thin gate oxides was measured using the American Society of Testing Materials (ASTM) test method F-1771. The measurements were performed on capacitors with an active area of 0.01 cm2. Two types of capacitors were probed:

"nested" capacitors (where the edges of the top electrode were located on thin gate oxide); and "overlap" capacitors where the edges of the top electrode were located on thick field oxide. Local oxidation of silicon (LOCOS) isolation was used for the capacitor fabrication. Three failure distributions were analyzed:

Vcrit, determined by the voltage at a current threshold of 0.001 A/cm2, which correlates with the onset of conduction;

Vsf, determined by the voltage at a current threshold of 0.1 A/cm2, which corresponds to the oxide soft failure component (an industry benchmark value); and Vhf, determined by an abrupt increase in the current through the capacitor, indicating permanent breakdown.

Results

Figure 1A:
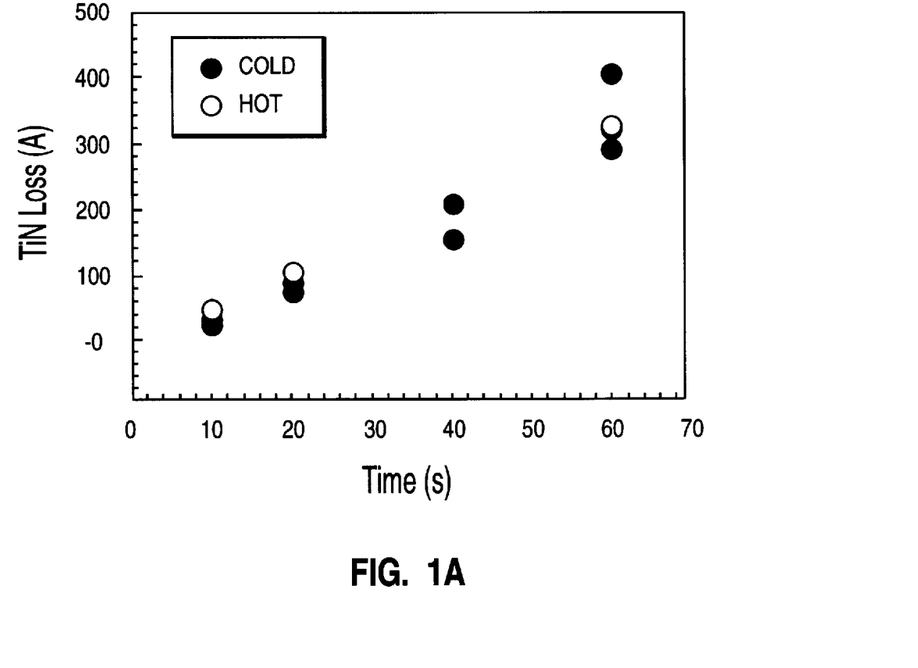
FIG. 1A shows the TiN removal as a function of the exposure time to the O2+C2F6 process, for blanket TiN layers processed at 250 C. and at room temperature.

FIG. 1A shows the TiN removal as a function of the exposure time to the O2+C2F6 process, for blanket TiN layers processed at 250 C. (Hot-open circles) and at room temperature (Cold-full circles). Note that the process temperature does not have a strong impact on the TiN removal process. TiN is normally etched using chlorine-based plasmas. TiO2 is extremely non-volatile (indeed refractory) and TiF4 is normally considered non-volatile as it sublimes at 284 C. at one atmosphere pressure. Thus, it is very surprising that the TiN removal can be adequately performed with an oxygen/fluorine ambient having a high O to F ratio, as the one used. A possible explanation for this is that the process under study is performed at low pressures (less than 2 torr) which could reduce the temperature at which TiF4 becomes volatile to below the process temperature, resulting in the etch of the TiN film.

Figure 2A:
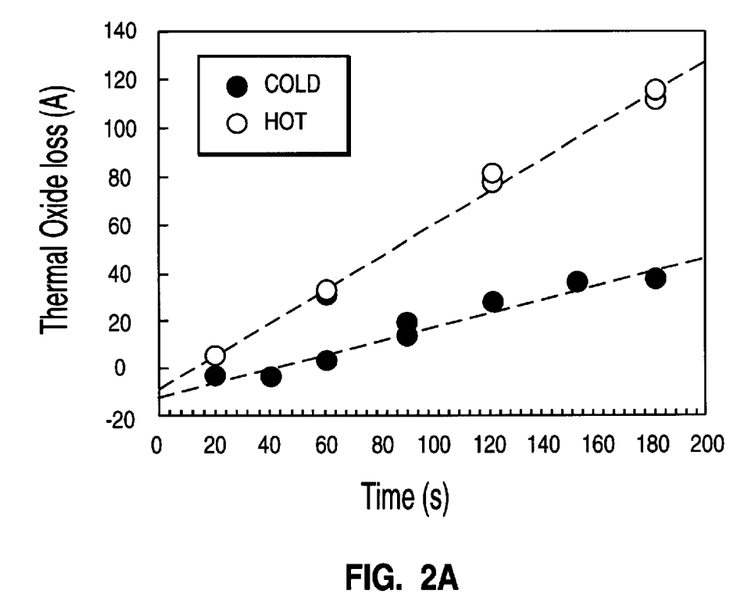
FIG. 2A shows the SiO2 loss as a function of the exposure time to the O2+C2F6 process.

FIG. 2A shows the SiO2 loss as a function of the exposure time to the O2+C2F6 process. The wafers were processed at 250 C. (Hot-open circles) or at room temperature (Cold-full circles). In the case of the SiO2 etch rate, the process temperature has a strong impact on the etch speed, as can be seen by the SiO2 loss plotted as a function of the exposure to the O2+C2F6 process (FIG. 2A). The etch selectivity of TiN towards SiO2, calculated using the results from FIGS. 1A and 2A, is equal to 9 and 18, respectively, for the cases of 250 C. and room temperature processing. Room temperature (<50 C.) processing is strongly preferred, to maximize the selectivity and minimize the SiO2 loss.

The TiN removal process can be integrated with the photoresist ash step, further simplifying the fabrication process. The photoresist layer might get cross-linked during the anisotropic etch of the top layers and the addition of C2F6 to the O2 plasma has proved to be very effective in stripping hardened photoresist without leaving polymer residues or "ears." Also, in the case where surface image photolithographic schemes are used, the removal of the silylated hard mask with fluorinated chemistries was found to be very efficient.

Figure 3A:
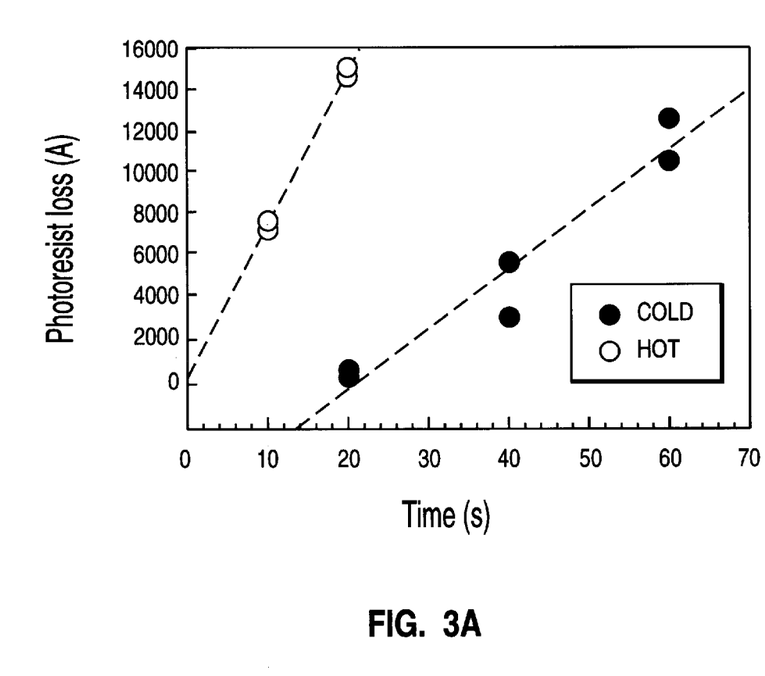
FIG. 3A shows photoresist loss as a function of the exposure time to the O2+C2F6 process.

FIG. 3A shows photoresist loss as a function of the exposure time to the O2+C2F6 process. The wafers were processed at 250 C. (Hot-open circles) or at room temperature (Cold-full circles). The ash rate of photoresist in the O2+C2F6 environment strongly depends on the process temperature, as can be seen in FIG. 3A for deep-UV positive photoresist. The removal of cross-linked and silylated photoresist follows the same trend, indicating that processing at 250 C. is desirable for fast photoresist stripping.

To accommodate the requirements of having fast TiN and photoresist removal while keeping high selectivity to SiO2 and W, the CDE process was divided in three steps:

First, an O2 with C2F6 process of short duration at 250 C. is used to remove the cross-linked/silylated photoresist and partially etch the TiN.

Second, a pure O2 ash at 250 C. is used to strip the bulk photoresist layer.

Finally, an O2 with C2F6 step at room temperature is used to completely remove the remaining TiN, with high selectivity to SiO2.

Figure 4A:
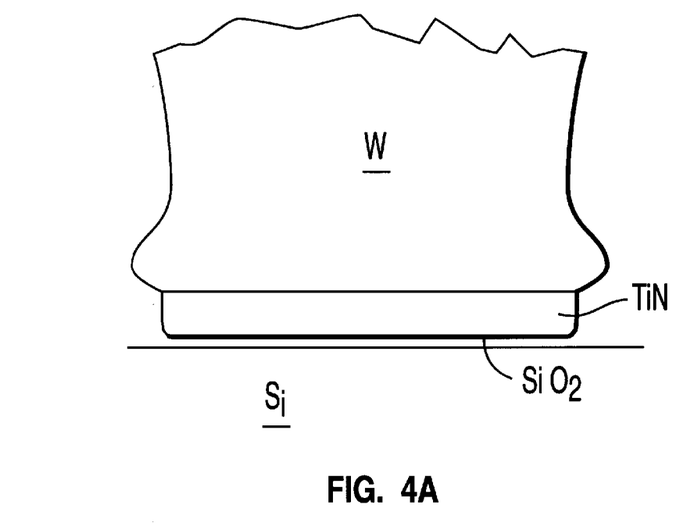
FIG. 4A is a tracing of a typical TEM photograph of a metal gate structure with 0.18 micron W length fabricated with the optimized CDE process on 3 nm gate oxide.

The duration of the various steps was optimized to minimize W and gate oxide loss as well as TiN undercut. This can be seen in FIG. 4A for a metal gate with 0.18 micron W length. (FIG. 4A is a tracing of a typical TEM photograph of a metal gate structure with 0.18 micron W length fabricated with the optimized CDE process on 3 nm gate oxide.) The TiN undercut was reduced to a minimum and the gate oxide loss was negligible. The CDE process was then tuned for the fabrication of sub-tenth-micron metal gate devices on <3 nm gate oxides.

Figure 5A:
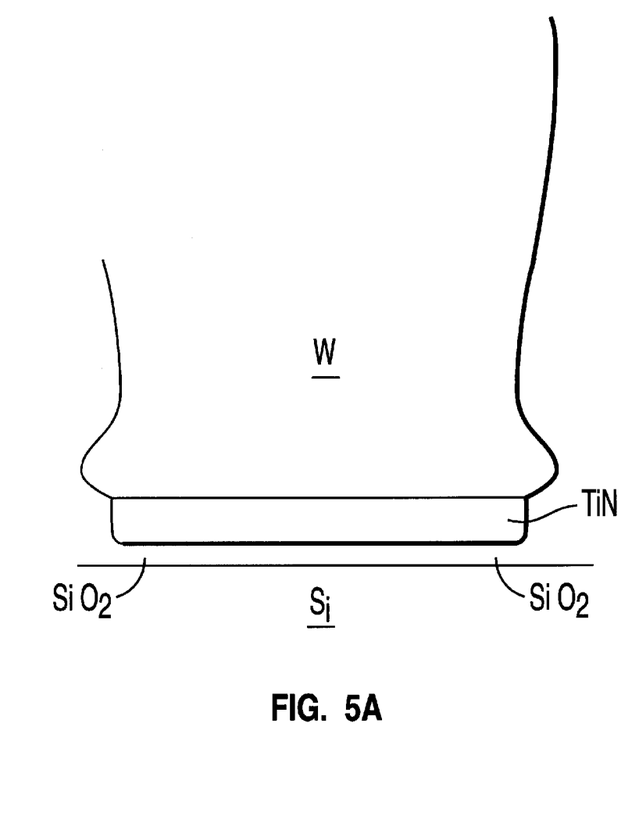
FIG. 5A shows a tracing from a TEM picture of a 0.06 micron metal gate structure.

FIG. 5A shows a tracing from a TEM picture of a metal gate structure. In this example a 0.06 micron W length is shown, to illustrate the surprising capabilities of the developed CDE process.

Figure 6A:
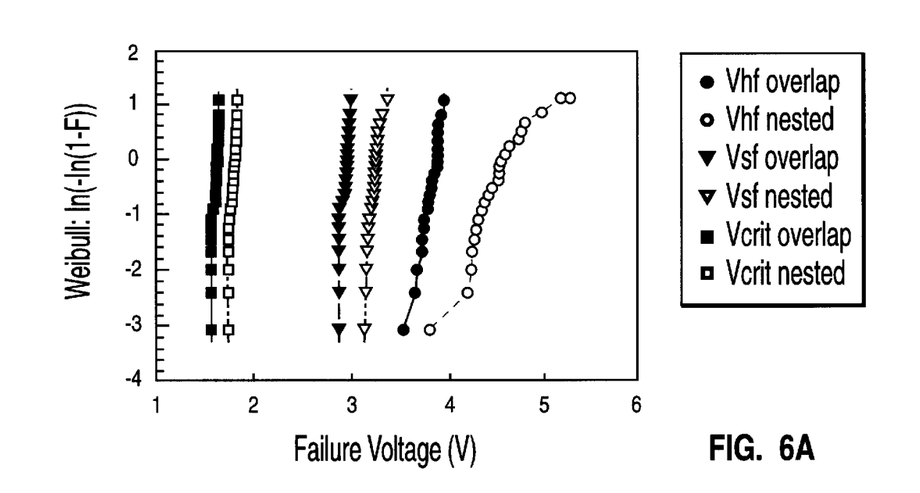
FIG. 6A shows the voltage breakdown characteristics of nested and overlap capacitors fabricated with W/TiN top electrode on 2.8 nm gate oxide.

In FIG. 6A, the GOI characteristics (Ramp voltage breakdown characteristics) of nested and overlap capacitors fabricated with W/TiN top electrode on 2.8 nm gate oxide are presented. These capacitors have W/TiN top electrodes, and were fabricated with the described CDE process. The capacitor area is 0.01 square cm. Vhf (circles) indicate hard failure, Vsf (inv-triangles) indicate 0.1 A/cm2 current threshold, and Vcrit (squares) indicate 0.001 A/cm2 current threshold. Open symbols represent nested capacitors, and full symbols represent overlap capacitors. Very sharp Weibull distributions for Vcrit, Vsf and Vhf were obtained indicating excellent uniformity of the gate fabrication process. Note that the nested devices have shown consistently better GOI values compared with the overlap ones (FIG. 6A). This proves that the CDE process does not cause any charge or corner damage to the gate oxide. It consequently eliminates the need of undercutting the TiN layer or performing a gate annealing for the fabrication of high performance sub-tenth-micron metal gate devices.

These results demonstrate that an advanced CDE process was successfully optimized for the definition of sub-tenth-micron metal gate structures. The substrate temperature and the gases used were chosen for high selectivity towards W and SiO2, eliminating the need of capping the W sidewall and preventing charge or corner damage to the gate oxide. The process can be integrated with the resist removal step, thus simplifying the fabrication flow. Devices with 0.06 micron gate length were successfully fabricated on gate oxides with below 3 nm thickness, and had excellent electrical characteristics.

Further Experimental Results

A further round of experiments studied CVD-W on PVD-TiN gate stacks with 3.3 nm gate oxide (measured by C-V at 3V in accumulation). This structure was compared with conventional poly-gate structures. Except for the gate stack deposition and definition steps (see FIG. 1B), both metal- and poly-gate devices have the same process flow, such as high temperature S/D RTA (>950 C.). Some of the metal-gate devices also received additional counter-doping (CD) channel implant to obtain a lower threshold voltage (Vt). Either pure oxide or a remote plasma nitrided oxide (RPNO) were used. Long channel (at least 10 micron) n/pMOS devices with the W/TiN gate were first fabricated to evaluate electron/hole mobility and gate oxide integrity (GOI). Since metal-gate has greater impact on pMOS, only metal-gate pMOS in sub-tenth-micron regime were further evaluated in this study. In this embodiment an angled pocket implant was also applied, to better control short channel effect for pMOS devices.

Some points to note in the results are as follows:
(1) The W/TiN gate n/pMOS with about 3.3 nm gate oxide showed well-behaved C-V characteristics, indicating good Si/SiO2 interface quality.
(2) Hardly any gate depletion is observed for the W/TiN metal gate device, as expected. For 3.3 nm gate oxide, a 17% improvement in Cinv(−1.5V)/Cacc(3.0V) is obtained for the metal-gate versus p+ poly-gate.
(3) For the W/TiN gate, a low gate sheet resistance of about 2 ohms per square (independent of gate length) is obtained.
(4) Metal-gate devices show higher hole mobility than that of the p+ poly-gate device (75 vs. 68 cm2/V-s at Eeff=0.6 MV/cm).
(5) For electron mobility, the W/TiN-gate nMOS has slightly lower (about 2%) low-field mobility but higher high-field mobility (280 vs. 266 cm2/V-s at Eeff=0.8 MV/cm) compared to the n+ injection (for both pure gate oxide and RPNO), but worse Qbd distribution under substrate (+VG) injection (for pure oxide only). While RPNO can greatly improve the +VG Qbd distribution for the W/TiN case.
(7) Excellent W/TiN pMOS (at about 0.07 micron Lgate) with Idrive (strong)=314 microA/micron (the drive current at Ioff=1 nA/micron and Vd=Vg=1.5V) is obtained; a p+ poly-gate PMOS with the same process flow shares Idrive (strong)=280 microA/micron at Lgate about 0.12 micron.
(8) Under+VG direct tunneling (DT) or Fowler-Nordheim (F-N tunneling injection, n-channel metal-gate device shows higher substrate hole current density (Jp) than the n+ poly-gate (by about an order magnitude larger). Thus the higher substrate hole current for the W/TiN-gate case is believed to have no impact on the thin (tox</=3.3 nm) gate oxide reliability.

Figures 1B, 2B:
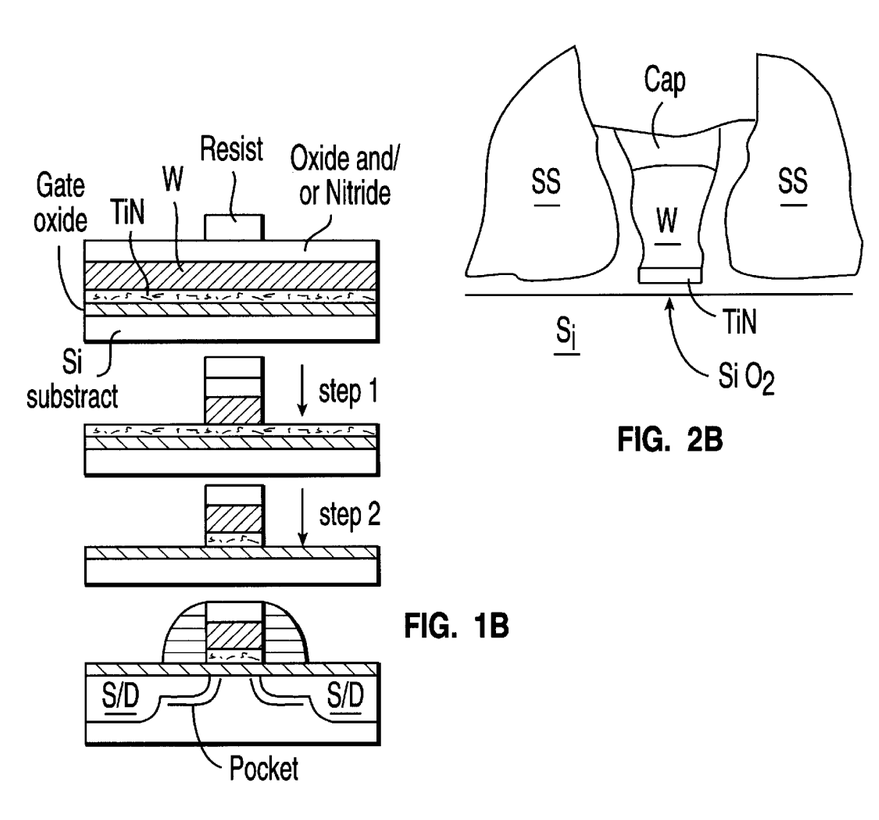
FIG. 1B shows an abbreviated flow of the metal-gate process.
FIG. 2B is a tracing of a cross sectional TEM of a W/TiN metal-gate structure.

FIG. 1B shows an abbreviated flow of the metal-gate process. In step 1, the CVD-W film is etched and the etch is stopped on TiN. In step 2, TiN is etched and no gate oxide loss is achieved (about 3.3 nm of oxide was left after TiN etch). The bottom of the figure shows the final device structure. Note that the etching of CVD-W and PVD-TiN are done separately to ensure no etch damage to the underlying gate oxide.

FIG. 2B is a tracing of a cross-sectional TEM of a W/TiN metal-gate device with Lgate about 0.06 micron.

Figure 3B:
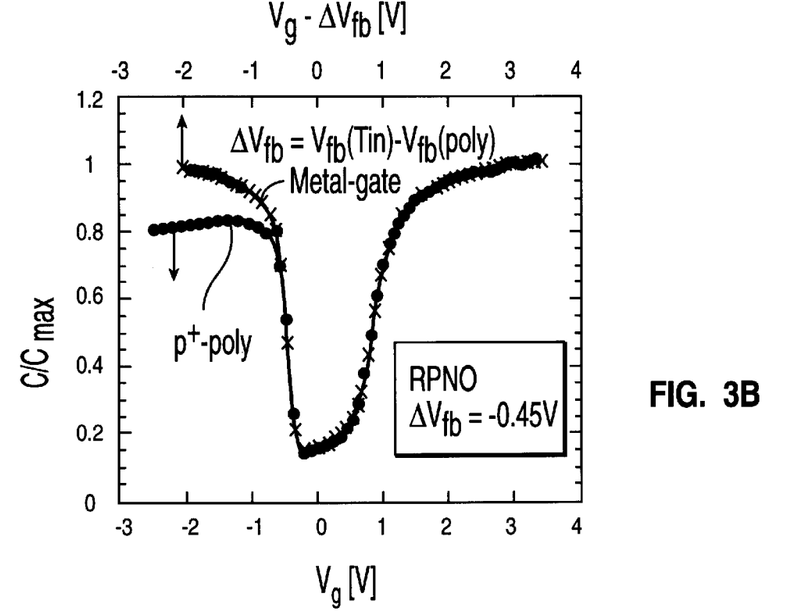
FIG. 3B shows C-V curves (RPNO) for pMOS devices with p+ poly- and metal-gate.

FIG. 3B shows C-V characteristics (RPNO) for pMOS devices with p+ poly- and metal-gate, respectively. An improvement of about 17% in Cinv/Cacc for the metal device from the p+ poly device can be obtained if the metal devices have the similar Vt as that of the poly devices at Vg=1.5V. The activated boron concentration in p+ poly is about 8×10^19 per cubic cm.

Figure 4B:
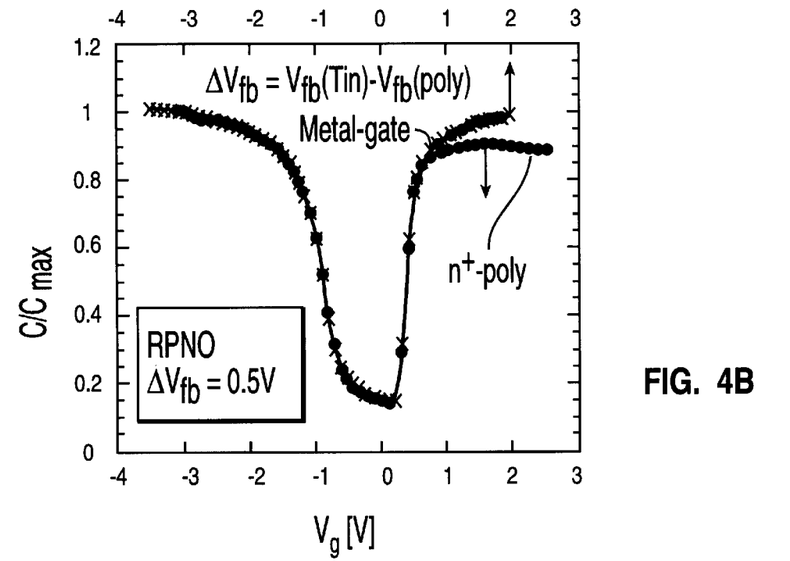
FIG. 4B shows C-V curves (RPNO) for nMOS devices with n+ poly- and metal-gate.

The C-V for nMOS devices are shown in FIG. 4B. The metal-gate devices show well-behaved C-V characteristics and marked improvement in Cinv/Cacc. (An improvement of about 7% in Cinv/Cacc for the metal device from the n+ poly device can be obtained if the metal devices have the similar Vt as that of the poly devices at Vg=1.5V.) The only differences in C-V between the metal and poly devices are flat band voltage (Vfb) and inversion capacitance. Based on the Vfb, the Fermi level of the PVFD TiN is at about Si mid-gap (about 0.55V below Si conduction band) as reported previously.

Figure 5B:
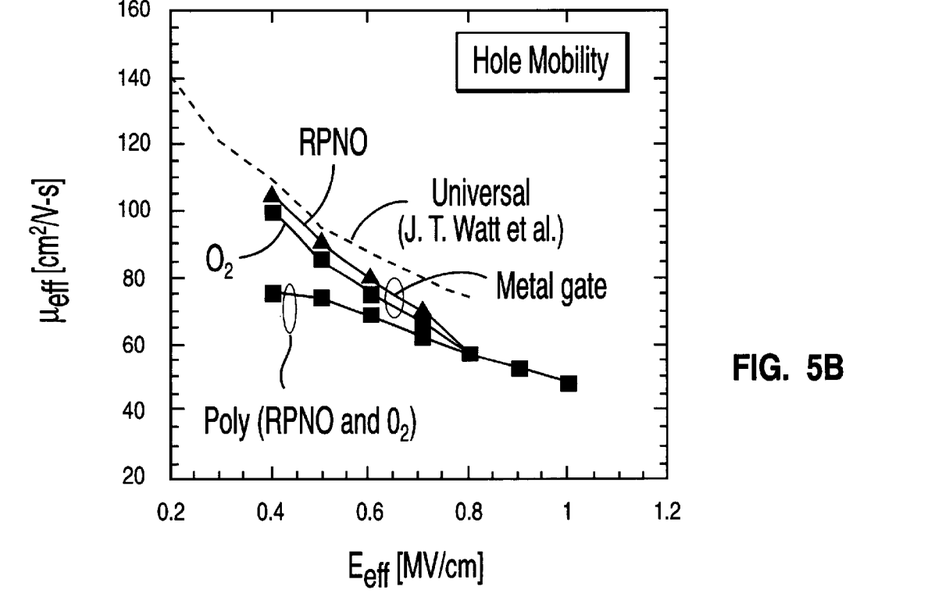
FIG. 5B shows hole mobility for pMOS devices with p+ poly- and metal-gate as well as different gate dielectrics (pure oxide and RPNO).

FIG. 5B compares the hole mobilities for pMOS devices with p+ poly- and metal-gate, as well as different gate dielectrics (3 nm of pure SiO2, or RPNO oxynitride); all the devices have the same channel implant. Also shown is the "Universal Mobility Curve" (Universal) for holes from J. T. Watt et al. The metal-gate pMOS is observed to have slightly higher hole mobility (and closer to the universal mobility) than the p+ gate case.

Figure 6B:
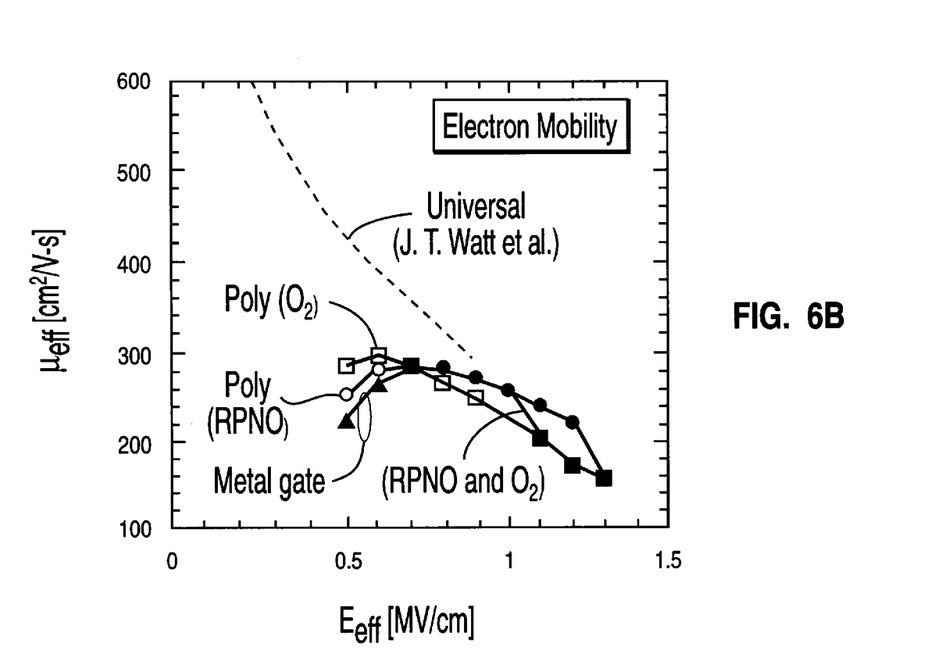
FIG. 6B shows electron mobility for NMOS devices with n+ poly- and metal-gate as well as different gate dielectrics (pure oxide and RPNO).

FIG. 6B illustrates electron mobility for the metal-gate and the n+ poly-gate nMOS with the two gate dielectrics. All the devices have the same channel implant. Also shown is the "Universal Mobility Curve" (Universal) for electrons from J. T. Watt et al. For the pure oxide case, the metal-gate nMOS shows slightly lower low-field electron mobility (about 2% degradation) but higher high-field mobility (about 5% improvement) than that of the poly-gate. For the RPNO case, both the metal-and the poly-gates have similar electron mobility.

Figure 7B:
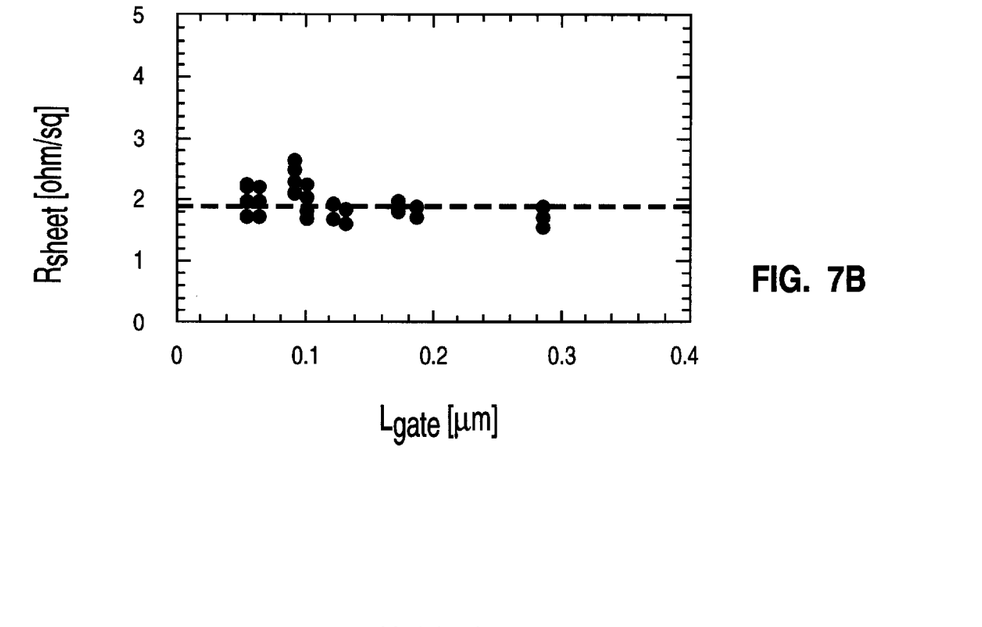
FIG. 7B shows gate sheet resistance vs. gate length for W/TiN gate.

FIG. 7B shows the relatively constant gate sheet resistance of the metal-gate (independent of gate length Lgate).

A low gate sheet resistance of about 2 ohms per square with no obvious gate-length dependence down to 0.06 micron is achieved.

Figure 8B:
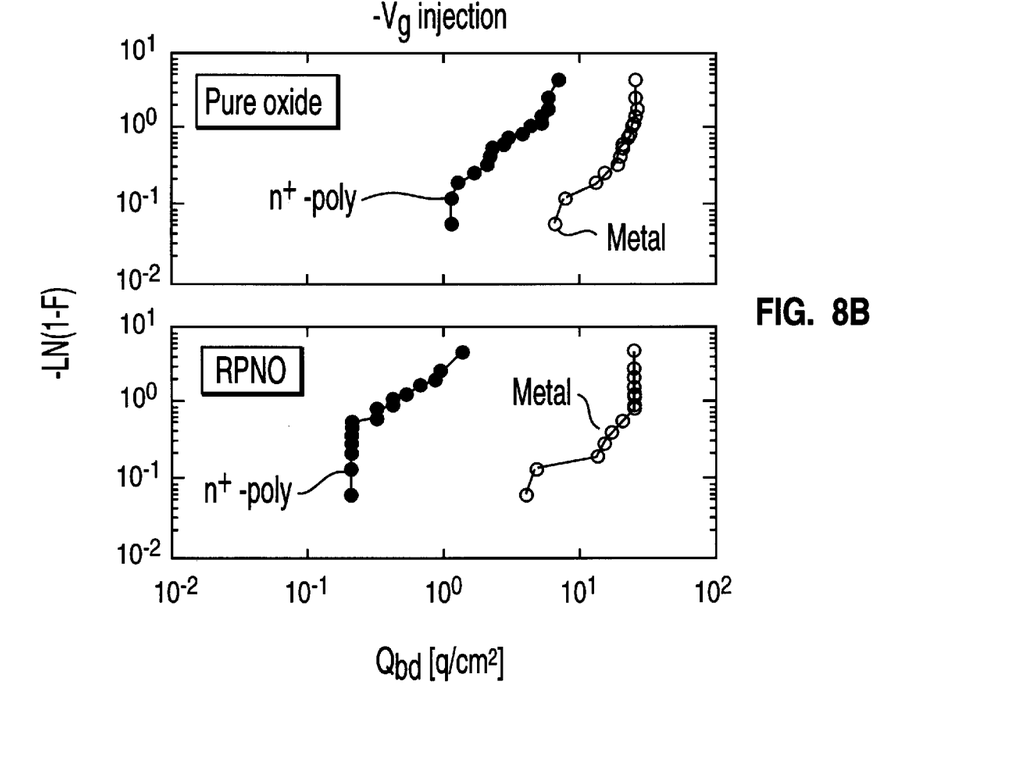
FIG. 8B shows Qbd for n+ poly- and metal-gate devices with either pure oxide or RPNO under gate injection.
Figure 9B:
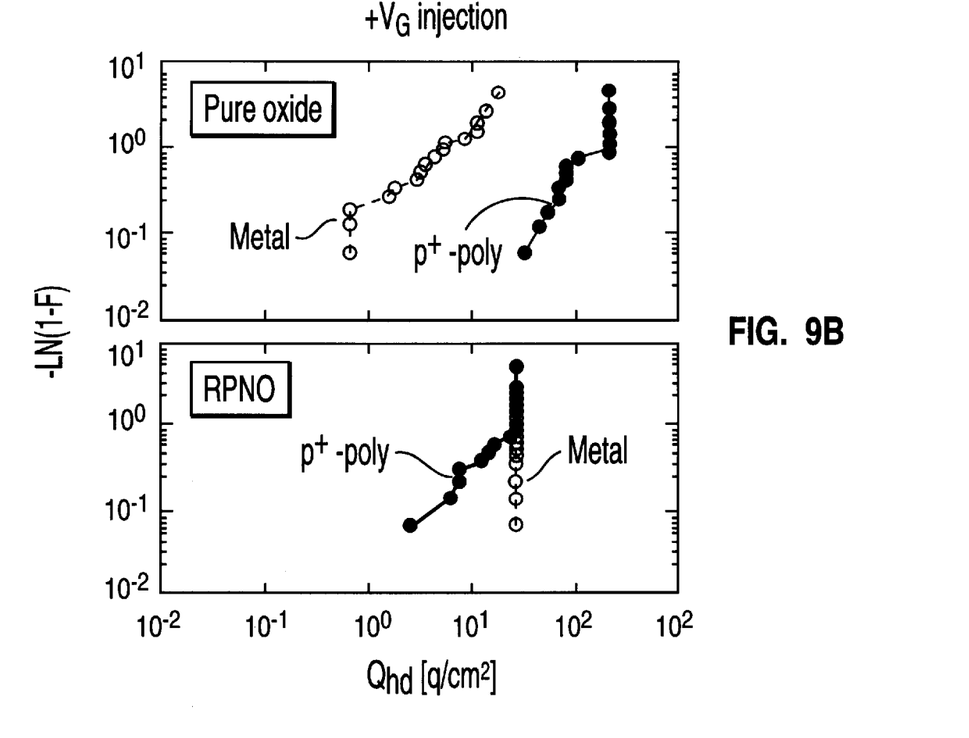
FIG. 9B shows Qbd for poly- and metal-gate devices with either pure oxide or RPNO under substrate injection.

FIGS. 8B and 9B show oxide charge-to-breakdown (Qbd) of metal-and poly-gate devices with either pure or RPNO gate oxides under −VG and +VG injection, respectively. Under −VG injection, the Qbd of metal gate is better than that of poly gate, consistent with previous report. Under +VG injection, Qbd of metal-gate shows marked improvement by using RPNO instead of pure oxide.

Figure 10B:
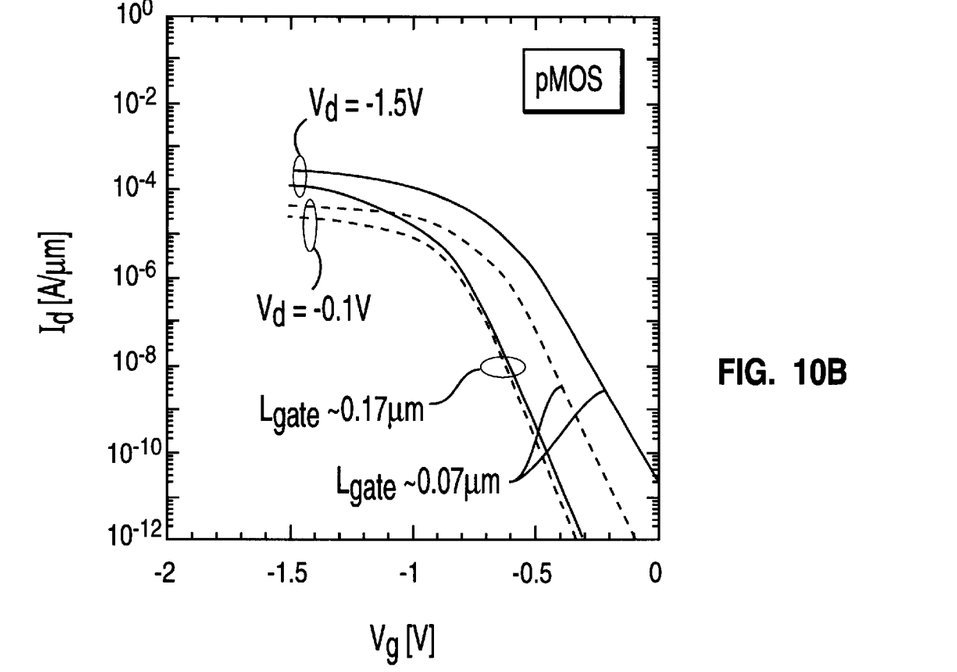
FIG. 10B shows Id vs. Vg (Vd=−0.1V, −1.5V) for metal-gate pMOS devices (with Lgate either about 0.07 micron or about 0.17 micron).

FIG. 10B shows Id versus Vg (Vd=0.1V or 1.5V) for 0.07 micron and 0.17 micron metal-gate pMOS transistors. Well-behaved sub-threshold characteristics are observed for these metal-gate devices.

Figure 11B:
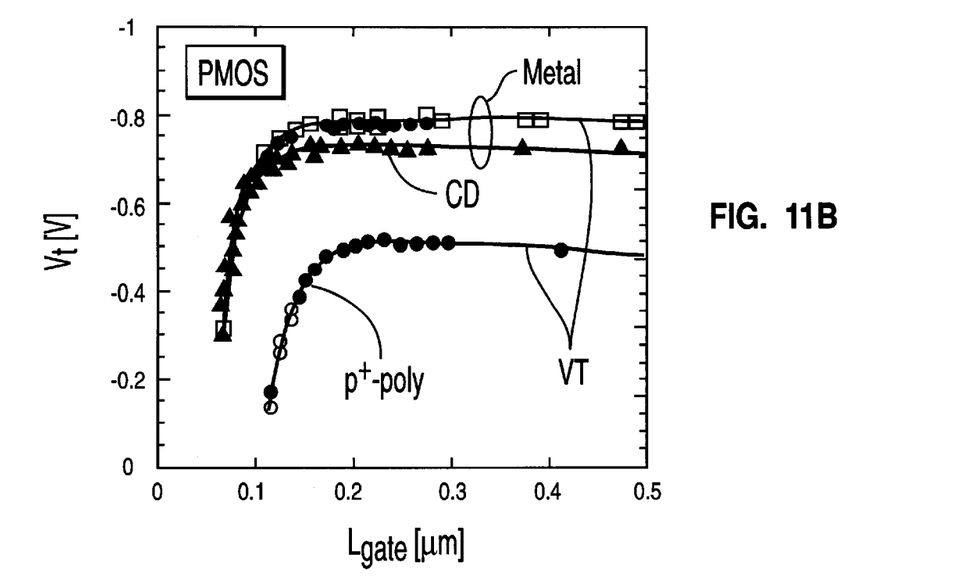
FIG. 11B shows Vt vs. Lgate for p+ poly- and metal-gate pMOS with the same VT channel implant.

FIG. 11B shows pMOS Vt roll-off Vs. Lgate for the metal-gate and the p+ poly-gate with the same channel implant (VT). Much higher Vt were obtained for the metal-gate devices because of the mid-gap work function of TiN. Also shown in FIG. 11B is a metal-gate device with some counter doping (CD) implant to decrease the long-channel Vt.

Figure 12B:
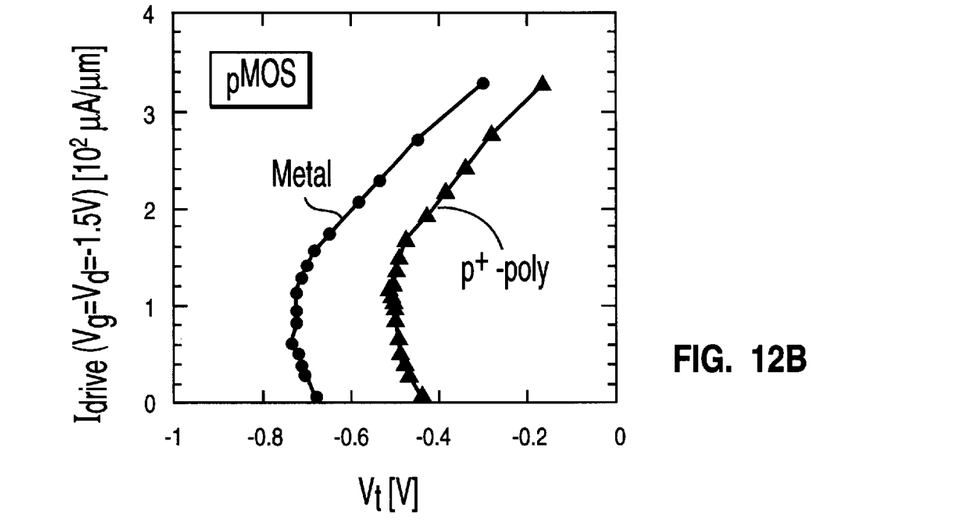
FIG. 12B shows Idrive Vt for p+ poly- and metal-gate pMOS (with VT channel implant).

FIG. 12B shows Idrive (Vg=Vd=−1.5V) vs. Vt for both metal- and poly-gate pMOS.

Figure 13B:
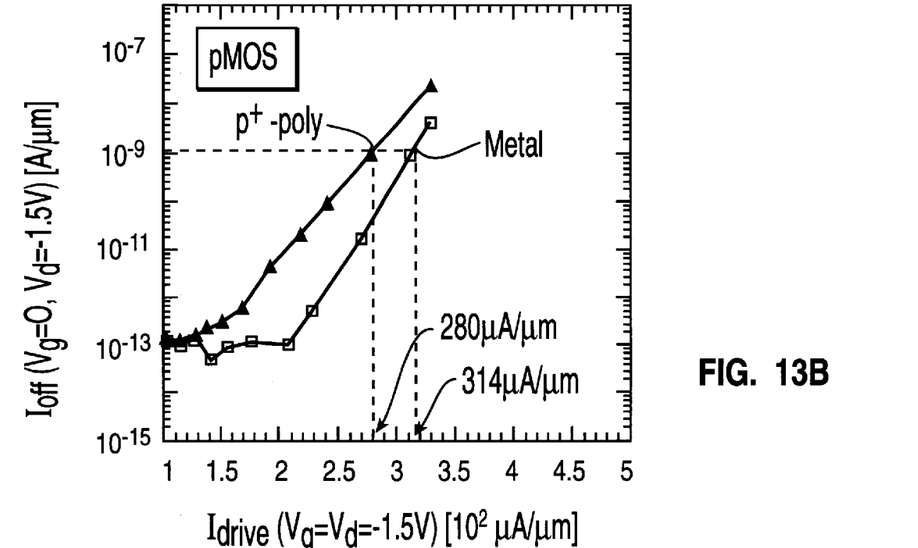
FIG. 13B shows Ioff vs. Idrive for p+ shown in FIG. 12B.

FIG. 13B shows Ioff (Vg=0 and Vd=−1.5v) vs. Idrive for the same devices shown in FIG. 12B. From FIGS. 12B and 13B, at the same Vt and Ioff, the metal-gate device shows a higher Idrive, which can be attributed to the higher hole mobility, higher Cinv/Cox, and smaller Leff (due to higher long-channel Vt) of the metal-gate compared to those of the poly-gate case.

Figure 14B:
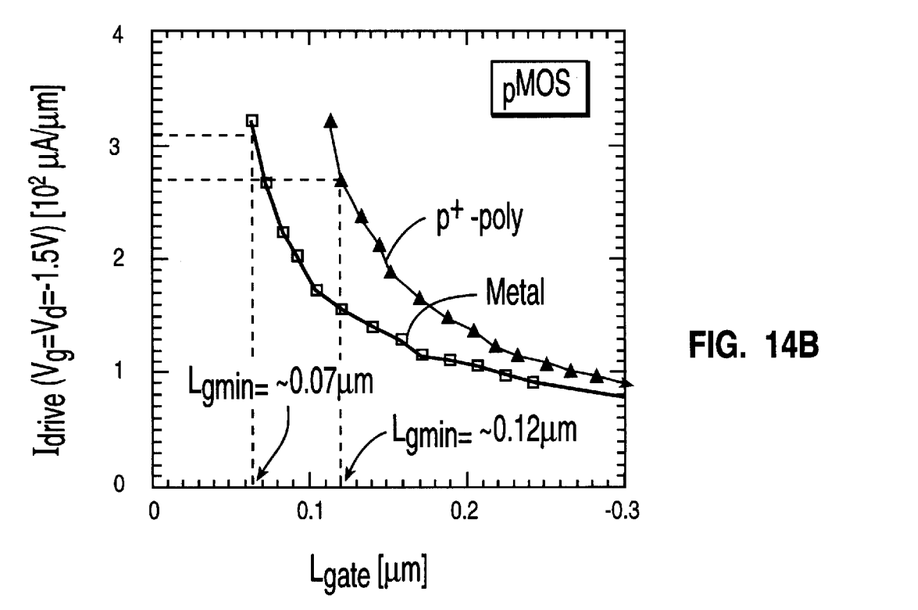
FIG. 14B shows Idrive vs. Lgate for p+ poly- and metal-gate pMOS shown in FIG. 13B.

FIG. 14B illustrates Idrive vs. Lgate for devices shown in FIG. 13B. The metal gate has Lgmin about 0.07 micron (minimum gate length when Ioff=1 nA/micron) and the p+ poly-gate has Lgmin about 0.12 micron. From FIGS. 13B and 14B, Idrive (strong)=314 microA/micron at Lgate about 0.07 micron for metal gate and Idrive(strong)=280 microA/micron at Lgate about 0.12 micron for poly-gate are obtained. When long-channel nMOS devices are under +VG (either direct tunneling DT or Fowler-Nordheim FN) tunneling injection, a higher substrate hole current (Jp) is observed for the W/TiN metal-gate device than the n+ poly-gate device.

Figure 15B:
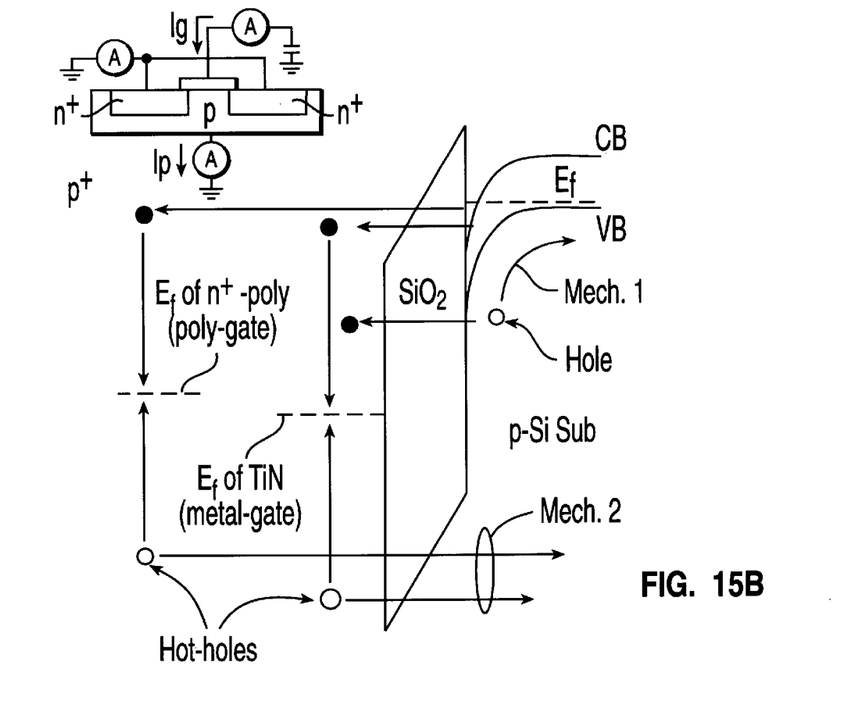
FIG. 15B shows the experimental setup in measuring Ip and Ig for nMOS as well as energy-band diagram.

FIG. 15B shows the measurement setup for the substrate hole current Jp and the gate current (Jg), as well as the energy-band for either n+ poly- or TiN-gate electrodes. For the thin oxide (tox</=3.7 nm) studied, the hole current can be attributed to either a) tunneling of valance-band electrons leaving free holes in the substrate ("mech 1" in FIG. 15B) or b) injection of anode hot-holes ("mech. 2").

Figure 16B:
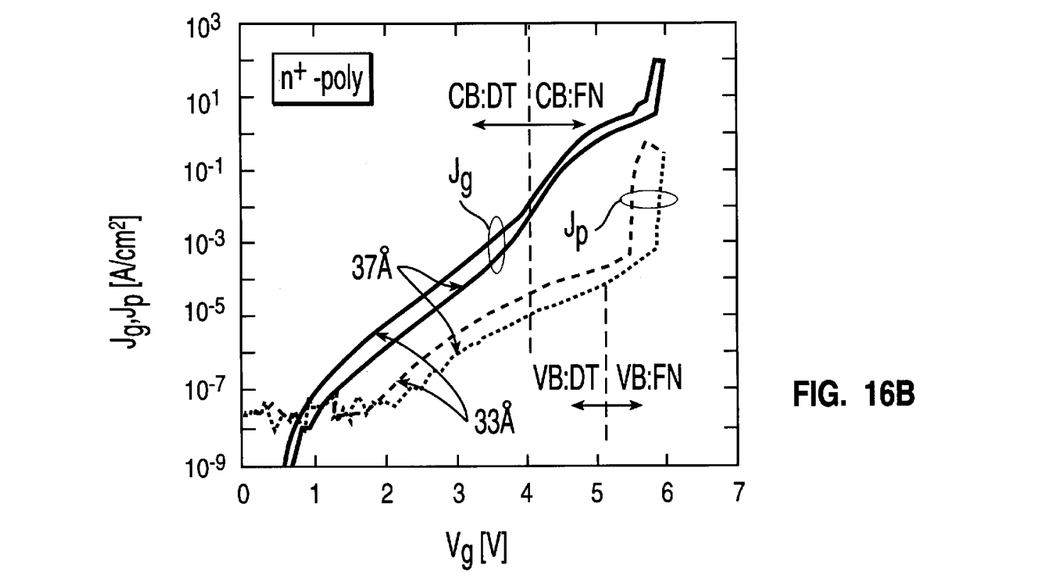
FIG. 16B shows Jg and Jp vs. Vg for n+ poly-gate nMOS with oxide thickness of 3.3 nm and 3.7 nm.
Figure 17B:
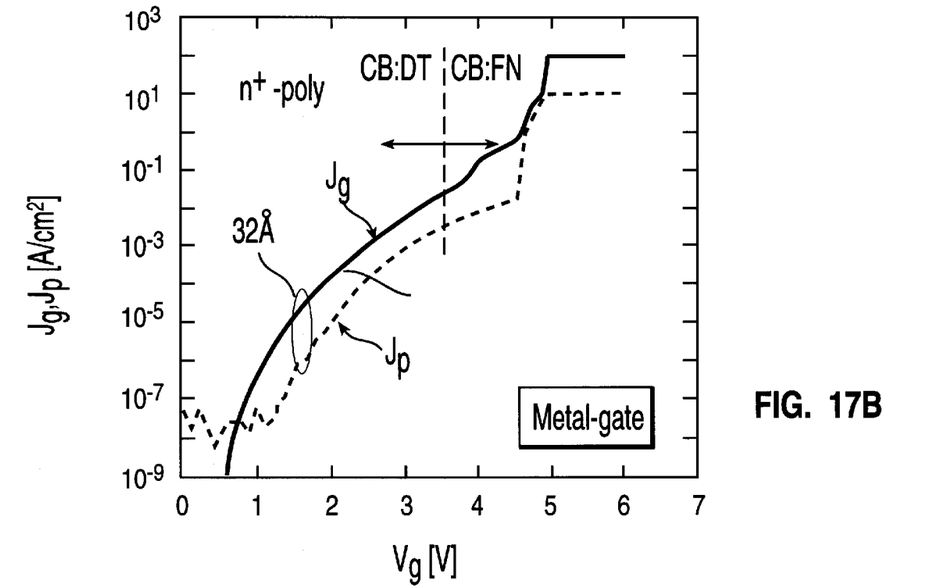
FIG. 17B shows Jg and Jp vs. Vg for metal-gate nMOS with oxide thickness of 3.2 nm.
Figure 18B:
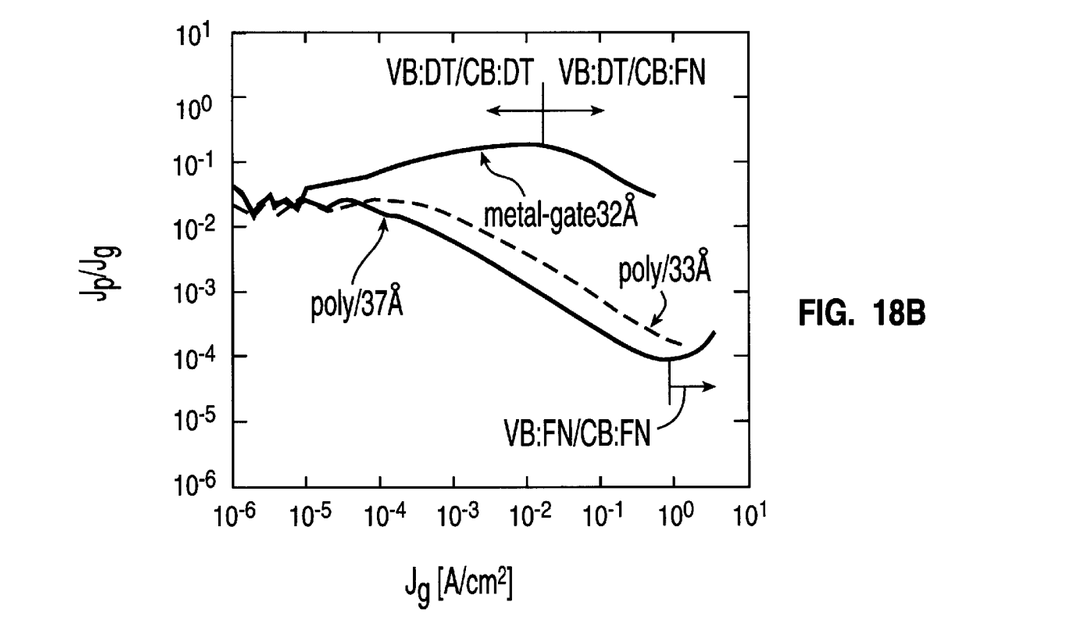
FIG. 18B shows Jp/Jg vs. Jg for the metal-gate and the n+ poly-gate shown in FIGS. 16B and 17B.

FIGS. 16B and 17B show Jp and Jg for n+ poly- and metal-gate devices, respectively, and FIG. 18B shows the corresponding Jp/Jg ratios vs. Jg. Although Jp/Jg is higher for the W/TiN case (which is seemingly in agreement with mech 2), it appears that the observed Jp is dominantly due to tunneling of valance-band electron (i.e., mech 1) because of the fact that the Jp characteristics do not follow the Jg when Jg is switching from direct to Fowler-Nordheim tunneling (FIGS. 16B and 17B). In addition, the Jp curve of the 3.7 nm case (FIG. 16B) also has a change in slope at Vox about 4.3V indicating a similar change of tunneling mechanism from DT to FN. Since the mech. 1 accounts for most of the hole current Jp, it appears that the observed higher Jp for the metal-gate devices has no impact on thin gate oxide (tox</=3.7 nm) reliability.

These results show that a W/TiN metal-gate stack can be incorporated into a conventional CMOS process flow in deep sub-micron and sub-tenth-micron regime. Well-behaved metal-gate devices with gate length down to sub-tenth-micron regime are obtained.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, in alternative embodiments the preferred SiO2 gate dielectric is replaced by oxynitride (as described in the IEDM papers cited above), or by Ta2O5, or by BST or PZT or other high-permittivity materials.

For another example, in alternative embodiments it is contemplated that the tungsten metallization can optionally be replaced by tungsten alloys, molybdenum alloys, or even an aluminum alloy.

For another example, in alternative embodiments it is contemplated that titanium nitride can optionally be replaced by titanium aluminum nitride, titanium silicon nitride, or titanium aluminum silicon nitride.

For another example, in alternative embodiments it is also contemplated that titanium tungsten nitride and related compounds can also optionally be used as diffusion barrier materials.

For another example, in alternative embodiments it is also contemplated that tungsten nitride and related compounds can also optionally be used as diffusion barrier materials. (However, these are somewhat less preferable, since the etch ratio of tungsten to the barrier layer is reduced.)

For another example, in alternative embodiments it is contemplated that titanium nitride can be replaced by other conductive nitrides. (For example, tantalum and chromium nitrides have been proposed as diffusion barriers.)

For example, other steps can optionally be added to the process recipes described.

While the inventions have been described with primary reference to a single-poly process, it will be readily recognized that these inventions can also be applied to process with two, three, or more layers of polysilicon or polycide.

Similarly, it will be readily recognized that the described process steps can also be embedded into hybrid process flows, such as BiCMOS or smart-power processes.

What is claimed is:

1. A method for etching a metal/barrier/dielectric gate stack during integrated circuit fabrication, comprising the steps of:

(a.) etching the metal, by plasma-assisted anisotropic etching, down to and into the barrier layer, and then (b.) etching the remainder of the barrier layer by a dry chemical-downstream-etching process which is selective to the gate dielectric, during which the barrier layer is not exposed to ion bombardment.

2. The method of claim 1, wherein the metal layer primarily comprises tungsten.

3. The method of claim 1, wherein the barrier layer primarily comprises titanium nitride.

4. The method of claim 1, wherein the dielectric consists of silicon dioxide.

5. The method of claim 1, wherein the metal layer is more than four times as thick as the barrier layer.

6. The method of claim 1, wherein the barrier layer is less than seven times as thick as the dielectric layer.

7. The method of claim 1, wherein said dry chemical-downstream-etching process includes oxygen and fluorine sources, and substantially no chlorine source, and has an oxygen to fluorine atomic ratio of more than 30:1.

8. The method of claim 1, wherein said dry chemical-downstream-etching process is performed at a temperature of less than 50 degrees C.

9. The method of claim 1, wherein said dry chemical-downstream-etching process is a multistage process which includes a final stage at a temperature of less than 50 degrees C., and at least one stage at a temperature of more than 100 degrees C.

10. The method of claim 1, wherein said dry chemical-downstream-etching process is a multistage process which includes an intermediate stage which removes photoresist residues, and does not erode said barrier layer.

11. A fabrication method, comprising the steps of:
(a.) forming a gate stack layer which at least partially overlies a semiconductor region, and which includes therein a dielectric capping layer overlying a metal conductor layer overlying a conductive diffusion barrier overlying a gate dielectric which provides capacitive coupling to said semiconductor region; and
(b.) etching said gate stack layer in a pattern, using a process which includes the substeps of:
forming a patterned layer of photoresist overlying said capping layer, and then
etching the capping layer and metal, by plasma-assisted anisotropic etching, down to and into the barrier metal, and then
etching the remainder of the barrier layer, and also removing the remainder of said photoresist, by a dry chemical-downstream-etching process, during which the barrier layer is not exposed to ion bombardment.

12. A fabrication method, comprising the steps of:
(a.) forming a gate stack layer which at least partially overlies a semiconductor region, and which includes therein
a metal conductor layer, overlying
a conductive diffusion barrier comprising titanium and nitrogen, overlying
a gate dielectric which provides capacitive coupling to said semiconductor region; and
(b.) etching said gate stack layer in a pattern, using a process which includes the substeps of:
(i.) etching the metal, by plasma-assisted anisotropic etching, down to and into the barrier metal, and then
(ii.) etching the remainder of the barrier layer by a dry chemical-downstream-etching process which includes oxygen and fluorine sources, and substantially no chlorine source, and has an oxygen to fluorine atomic ratio of more than 30: 1, during which the barrier layer is not exposed to ion bombardment.

* * * * *